(12) United States Patent
Burrows et al.

(10) Patent No.: US 9,741,968 B2
(45) Date of Patent: Aug. 22, 2017

(54) LUMINAIRE AND INDIVIDUALLY REPLACEABLE COMPONENTS

(71) Applicant: UNIVERSAL DISPLAY CORPORATION, Ewing, NJ (US)

(72) Inventors: Paul E. Burrows, Chattaroy, WA (US); Emory Krall, Philadelphia, PA (US); Huiqing Pang, Newtown, PA (US); Jason Paynter, Bristol, PA (US); Kamala Rajan, Newtown, PA (US); Ruiqing Ma, Morristown, NJ (US); Gregory McGraw, Yardley, PA (US)

(73) Assignee: UNIVERSAL DISPLAY CORPORATION, Ewing, NJ (US)

(*) Notice: Subject to any disclaimer, the term of this patent is extended or adjusted under 35 U.S.C. 154(b) by 0 days.

(21) Appl. No.: 13/895,892

(22) Filed: May 16, 2013

(65) Prior Publication Data

US 2014/0027740 A1    Jan. 30, 2014

Related U.S. Application Data

(60) Provisional application No. 61/653,218, filed on May 30, 2012.

(51) Int. Cl.
*H01L 51/52* (2006.01)
*F21S 8/06* (2006.01)
(Continued)

(52) U.S. Cl.
CPC ............ *H01L 51/5275* (2013.01); *F21S 8/06* (2013.01); *F21V 3/0436* (2013.01); *F21V 17/12* (2013.01);
(Continued)

(58) Field of Classification Search
CPC .......... F21S 8/06; F21V 17/12; F21V 3/0436; F21Y 2105/008; H01L 51/5275; F21K 9/135; F21K 9/52
(Continued)

(56) References Cited

U.S. PATENT DOCUMENTS

| | | |
|---|---|---|
| 4,769,292 A | 9/1988 | Tang et al. |
| 5,247,190 A | 9/1993 | Friend et al. |

(Continued)

FOREIGN PATENT DOCUMENTS

| | | |
|---|---|---|
| EP | 1431656 A3 | 3/2007 |
| WO | 2008057394 | 5/2008 |
| WO | 2010011390 | 1/2010 |

OTHER PUBLICATIONS

Baldo et al.,"Highly efficient phosphorescent emission from organic electroluminescent devices", Nature, vol. 395, pp. 151-154, 1998.
(Continued)

*Primary Examiner* — Whitney T Moore
(74) *Attorney, Agent, or Firm* — Morris & Kamlay LLP

(57) ABSTRACT

Luminaires and luminaire components are provided that may include emissive, index-matching, and/or outcoupling components that are replaceable separately from other components of the luminaire. In some embodiments, an index-matching component may include a gel sheet or pad that can be disposed between an emissive component and an outcoupling component. The index-matching component may be replaceable separately from the emissive and outcoupling components. In some embodiments, an emissive component including an OLED panel and/or an index-matching component may be replaceable separately from other components of the luminaire.

19 Claims, 16 Drawing Sheets

(51) Int. Cl.
*F21V 3/04* (2006.01)
*F21V 17/12* (2006.01)
*F21V 17/00* (2006.01)
*F21Y 105/00* (2016.01)
*F21Y 115/15* (2016.01)

(52) U.S. Cl.
CPC ......... *F21V 17/002* (2013.01); *F21Y 2105/00* (2013.01); *F21Y 2115/15* (2016.08)

(58) Field of Classification Search
USPC .......................................................... 257/40
See application file for complete search history.

(56) References Cited

U.S. PATENT DOCUMENTS

| | | |
|---|---|---|
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,776,496 B2 | 8/2004 | Cok |
| 6,984,934 B2 | 1/2006 | Moeller et al. |
| 7,279,704 B2 | 10/2007 | Walters et al. |
| 7,431,968 B1 | 10/2008 | Shtein et al. |
| 7,968,146 B2 | 6/2011 | Wagner et al. |
| 7,990,059 B2 | 8/2011 | Matsudate et al. |
| 8,125,138 B2 | 2/2012 | Luttgens et al. |
| 8,179,029 B2 | 5/2012 | Boerner et al. |
| 8,310,150 B2 | 11/2012 | Forrest et al. |
| 2003/0230980 A1 | 12/2003 | Forrest et al. |
| 2004/0119402 A1* | 6/2004 | Shiang .................. F21V 15/01 313/506 |
| 2004/0174116 A1 | 9/2004 | Lu et al. |
| 2007/0267976 A1* | 11/2007 | Bohler et al. ................. 315/112 |
| 2010/0181899 A1 | 7/2010 | Forrest et al. |
| 2010/0201256 A1 | 8/2010 | Xue et al. |
| 2010/0258821 A1 | 10/2010 | Forrest et al. |
| 2011/0226147 A1* | 9/2011 | Trantoul et al. ............... 101/483 |
| 2012/0236569 A1* | 9/2012 | Chang et al. ................. 362/294 |

OTHER PUBLICATIONS

Baldo et al.,"Very high-efficiency green organic light-emitting devices based on electrophosphorescence", Applied Physics Letter, vol. 75, No. 1, pp. 4-6, 1999.

Mehta, et al., "Light out-coupling strategies in organic light emitting devices", Proceedings of ASID; Oct. 8-12, 2006; pp. 198-201.

Saxena, et al., "A review on the light extraction techniques in organic electroluminescent devices", Optical Materials; vol. 32; c. 2009; pp. 221-233.

Extended European Search Report for EP application 13169771.6, dated Jun. 2, 2016.

* cited by examiner

FIG. 18
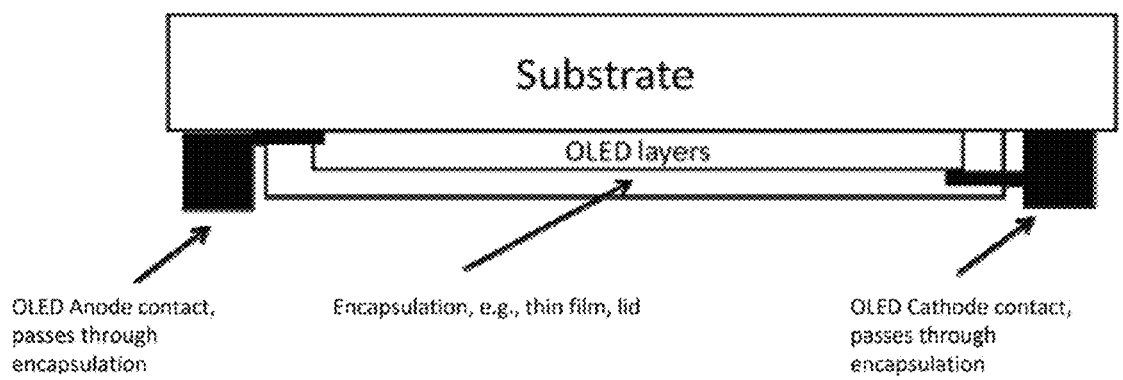
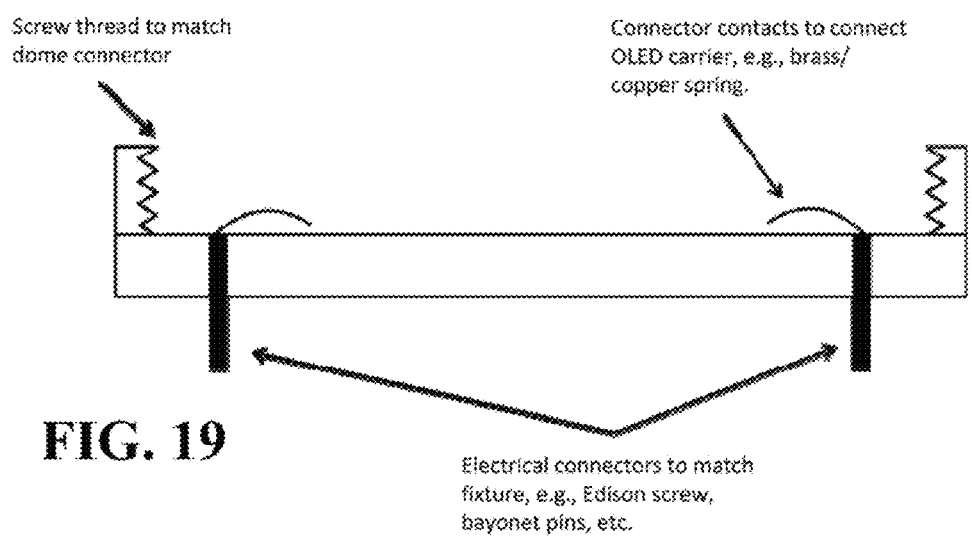
FIG. 19
FIG. 20

LUMINAIRE AND INDIVIDUALLY REPLACEABLE COMPONENTS

PRIORITY

This application claims priority to U.S. Provisional Application No. 61/653,218, filed May 30, 2012, the disclosure of which is incorporated by reference in its entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices and, more specifically, to luminaires and related devices that incorporate OLEDs, index matching components, and/or other components that are separately replaceable within the device.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)3, which has the following structure:

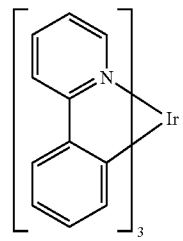

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

Luminaires and luminaire components are provided that may include emissive, index-matching, and/or outcoupling components that are replaceable separately from other components of the luminaire. In some embodiments, an index-matching component may include a gel sheet or pad that can be disposed between an emissive component and an outcoupling component. The index-matching component may be replaceable separately from the emissive and outcoupling components. In some embodiments, an emissive component including an OLED panel and/or an index-matching component may be replaceable separately from other components of the luminaire.

In an embodiment, a device such as a luminaire may include an emissive package configured to connect to a luminaire body to form a luminaire. The emissive package may include an organic emissive component configured to connect to the luminaire body, and an index-matching component disposed at least partially above the opposite side of the organic emissive component. At least a portion of the emissive package may be replaceable separately from an outcoupling component of the luminaire. Similarly, the index-matching component may be replaceable separately from the outcoupling component and/or the organic emissive component. The index-matching component may include, for example, a gel pad, a disposable gel pad or packet, a gel sheet, or an otherwise encapsulated gel. The gel may be or include, for example, a transparent material having a Young's modulus of 0.1 MPa to 1 GPa. The index-matching component may have an index of refraction within 90% of the index of refraction of the outcoupling component and/or an emissive surface material of the emissive component. In some cases, the index of refraction may be in the range 1.4-2.0. The outcoupling component may have a shape selected from the group consisting of: a dome, pyramid, a parallelpiped, and a hemisphere, or combinations thereof. The organic emissive component may have an outline shape substantially equivalent to a cross-section of the outcoupling component in a plane parallel to the organic emissive component. In some configurations the organic emissive component may include an OLED having an emissive area of about 60-90% or 60-75% the area of a surface of the outcoupling component, such as the largest cross-section of the outcoupling component taken in a plane parallel with the OLED in the device. This may allow, for example, the OLED to appear to fill the outcoupling component when viewed at less than 3 m, or from a distance in the range 1-5 m. This may also allow light provided by a luminaire to include light at a first color when viewed at a first angle from the luminaire, which is different from a color when viewed from a second angle from the luminaire, thus providing a color wash around the luminaire.

In an embodiment, a replaceable component for a luminaire is provided. The luminaire may have different components including an organic emissive component such as an OLED panel, and an outcoupling component configured to outcouple light from the organic emissive component. The replaceable component may include an index-matching material, and may be replaceable separately from at least one other component of the luminaire. The replaceable component may be sufficiently deformable to conform to irregularities in the surface of the organic emissive component and/or the outcoupling component when placed in physical contact with those components. The index-matching material may have an index of refraction within about 90% of an index of refraction of the outcoupling and/or emissive components, and may have a Young's modulus of 0.1 MPa to 1 GPa and/or an index of refraction of about 1.4-2.0. The index-matching material may be included in a single physical structure with the organic emissive component, such that they may be replaced simultaneously within the luminaire, or one or both components may be replaceable separately from the other. In some configurations the organic emissive component may include an OLED having an emissive area of about 60-90% or 60-75% the area of a surface of the outcoupling component, such as the largest cross-section of the outcoupling component taken in a plane parallel with the OLED in the device. This may allow, for example, the OLED to appear to fill the outcoupling component when viewed at less than 3 m or from a distance in the range 1-5 m. This may also allow light provided by a luminaire to include light at a first color when viewed at a first angle from the luminaire, that is different from a color seen when viewed from a second angle from the luminaire, thus providing a color wash in one area of the luminaire.

In an embodiment, a replaceable component for a luminaire is provided that includes an OLED. The replaceable component may be configured to connect optically to a physically-separate outcoupling component within the luminaire. The replaceable component also may be configured to connect optically to a physically-separate index matching component within the luminaire. The physically-separate index matching component may provide an optical connection between the replaceable component and an outcoupling component of the luminaire.

In an embodiment, an organic emissive component configured to connect to a luminaire device having an ellipsoidal outcoupling component is provided. The emissive component may include an OLED with an emissive area of about 60-75% or 60-90% of the area of the largest cross-section of the outcoupling component in a plane parallel with the OLED when the OLED is connected to the luminaire device. An index-matching component may be disposed above the OLED and between the OLED and the outcoupling component when the organic emissive component is connected to the luminaire device. The outcoupling component may have an index of refraction of about 1.4-2.0.

In an embodiment, a luminaire having an ellipsoidal outcoupling component with a base cross-section area A and an OLED with an emissive area in the range 0.6 A-0.9 A is provided. The OLED may have a physical pattern matched to the ellipsoidal outcoupling component, and may have an emissive area of not more than about 0.75 A. An index-matching component may be disposed between the OLED and the outcoupling component. The index matching component may be replaceable separately from the OLED, the outcoupling component, or both. Similarly, the OLED may be replaceable separately from the outcoupling component and/or the index-matching component. The outcoupling component may have a refractive index not less than the refractive index of the OLED. Light provided by the luminaire may include light having a first color when viewed from a first angle of the outcoupling component and light having a second color, different from the first color, when viewed from a second angle of the outcoupling component. The OLED may have an apparent size of 0.9 A-A when viewed from less than 3 m or from a distance in the range 1-5 m.

In an embodiment, an index matching packet including an index matching material is provided. The index-matching material may be transparent with a Young's modulus of 0.1 MPa to 1 GPa and a refractive index of 1.4-2.0. The packet may be in the form of a gel sheet or gel pad of the index matching material, and may be sufficiently deformable to conform to irregularities in the surface of an adjacent OLED component and/or an adjacent outcoupling component when under a relatively small amount of pressure, such as 10 psi or less. The gel pad may itself be coated with an index matching oil or grease.

In some embodiments, an organic emissive component may include an OLED having a visible pattern which, when viewed from a distance less than 3 m, or from a distance in the range 1-5 m from the luminaire, appears to fill the outcoupling component. Such an effect may be achieved even when the emissive area of the OLED is less than the largest dimension of the outcoupling component parallel to the OLED, for example when the OLED is 60-90% or 60-75% the area of the outcoupling component surface parallel to the OLED.

BRIEF DESCRIPTION OF THE DRAWINGS

FIG. 18 shows an example OLED module according to an embodiment of the invention, which can be disposed between an outcoupler and a fixture as shown in FIG. 16.

FIG. 19 shows a fixture designed to clamp an OLED panel into an outcoupler according to an embodiment of the invention.

FIG. 20 shows an index-matching gel pad according to an embodiment of the invention, which is placed between an OLED and an outcoupler.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
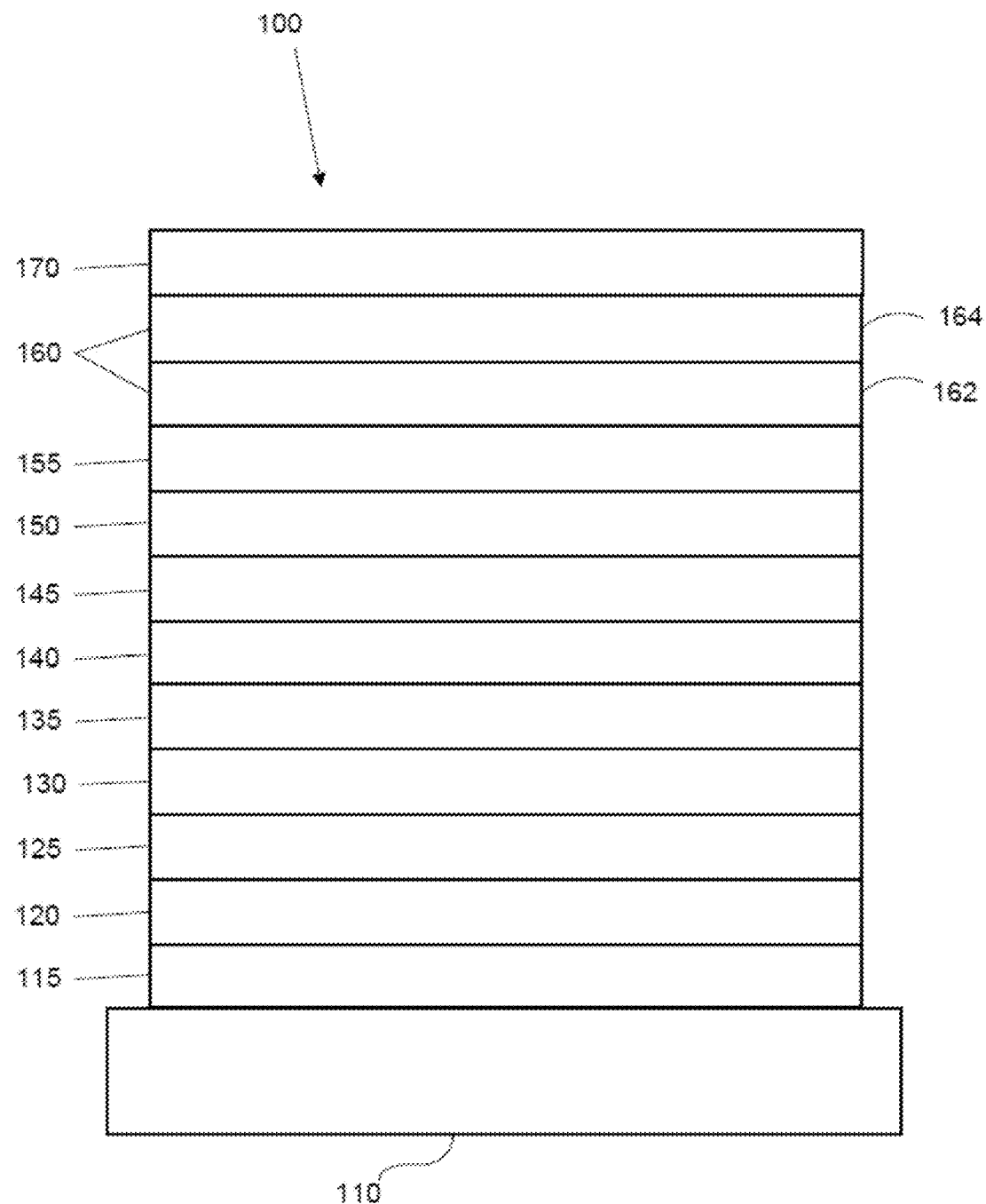
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
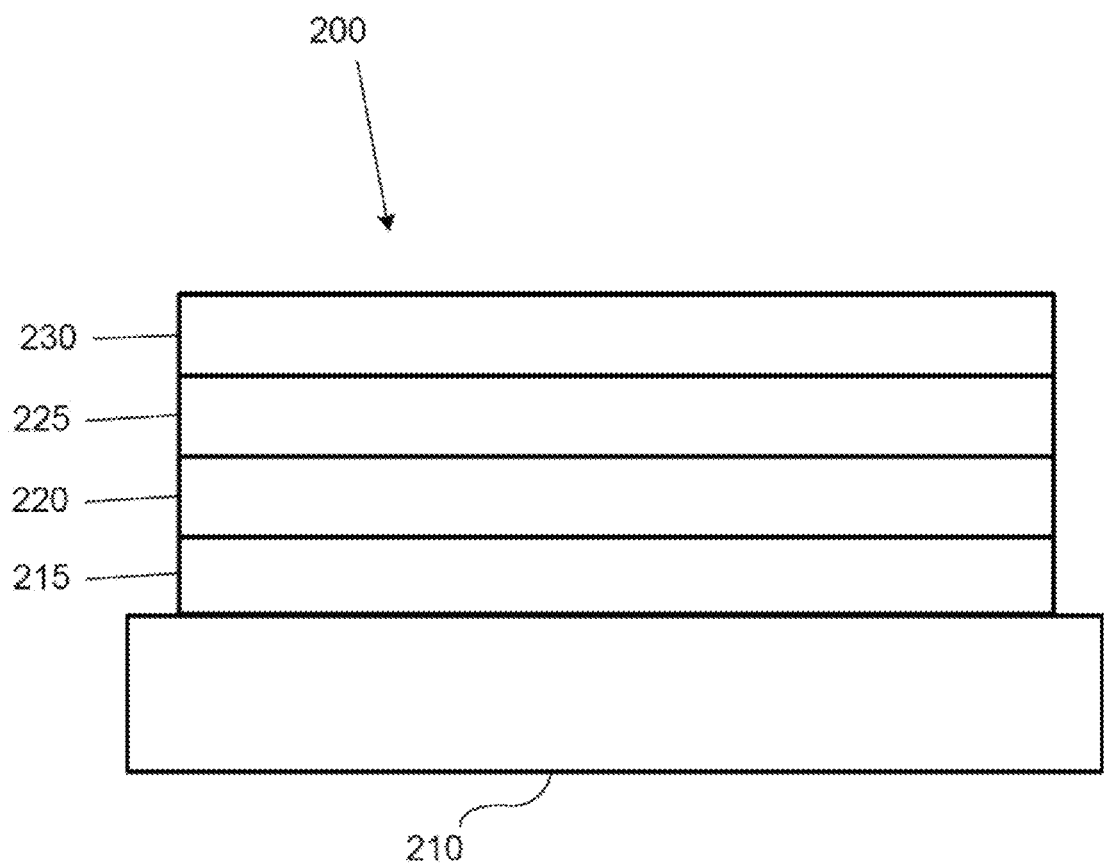
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18° C. to 30° C., and more preferably at room temperature (20-25° C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylalkyl, heterocyclic group, aryl, aromatic group, and heteroaryl are known to the art, and are defined in U.S. Pat. No. 7,279,704 at cols. 31-32, which are incorporated herein by reference.

Figure 3:
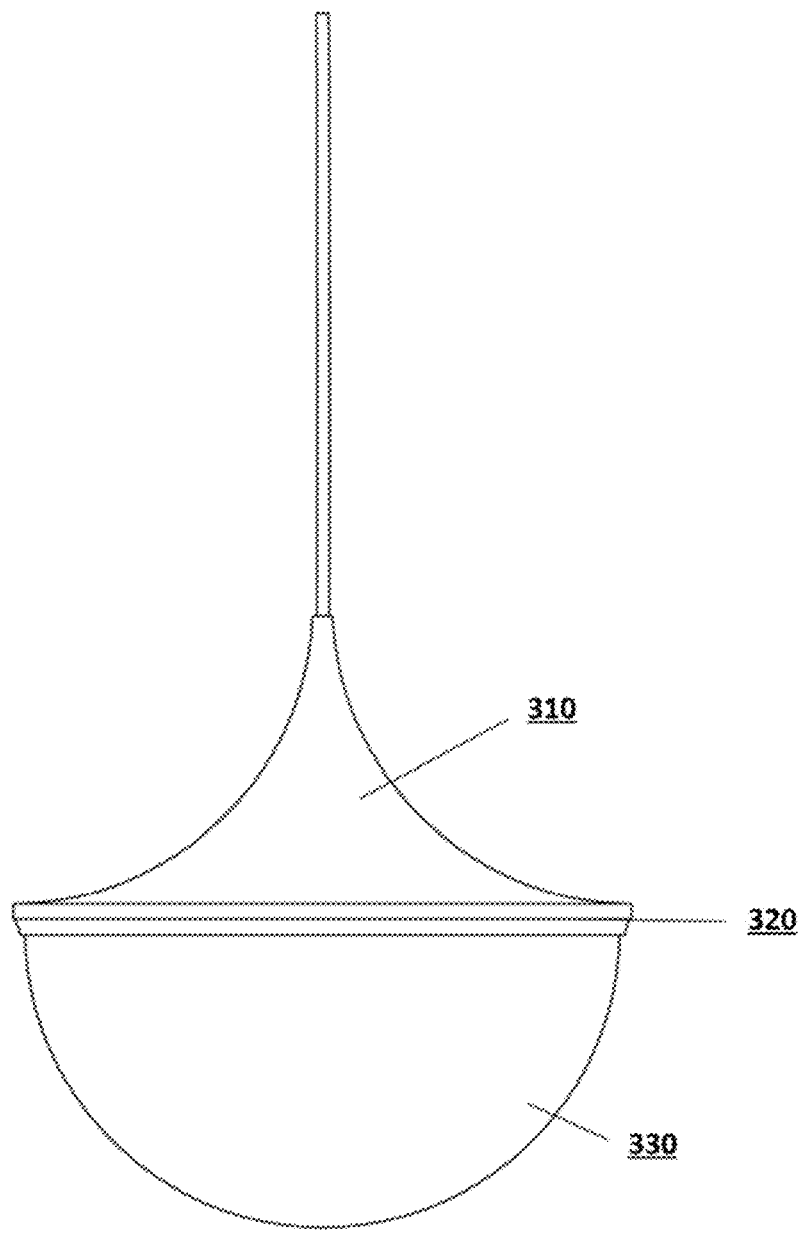
FIG. 3 shows an example luminaire with an emissive panel, a fixture shell, and an outcoupling component according to an embodiment of the invention.

OLEDs also may be incorporated into various devices, such as luminaires, which can be used to provide specific or general-purpose lighting. For example, an OLED luminaire has been demonstrated that features a flat, circular OLED inset in an acrylic hemisphere or dome outcoupler. Such a configuration has been found to provide approximately twice the efficacy of the OLED alone. The plate carrying the OLED may be sealed to the dome using epoxy applied around the edge of the plate. An example of such a device is shown in FIG. 3. An air gap between the plate and the dome may be filled with index-matching material, such as a fluid. The use of an index-matching material may be preferred to prevent loss of efficiency due to light reflecting back into the OLED at the substrate/air interface. When a fluid is used, the filling process may be performed slowly so as to avoid the introduction of air bubbles into the space. Air bubbles may reduce the outcoupling efficiency and be aesthetically unpleasing, because even small bubbles may be magnified by the outcoupling dome. If the OLED were to fail, therefore, the entire unit (OLED and dome outcoupler) would have to be replaced, since replacing the OLED alone would require breaking the epoxy seal and refilling the space between the OLED and the outcoupler with fluid. The process of refilling the space with fluid and re-creating the seal between the OLED and the outcoupler may be complex and/or hazardous, making it unsuitable to be performed by end users. Embodiments disclosed herein provide additional configurations that allow for optimization of such a device for an end user such as a consumer, especially in view of the relatively high cost of the plastic dome, drive electronics and fixturing, and the limited lifetime of OLED lighting panels.

From a consumer point of view, unless the operating and shelf lifetime of a light emitter is measured in decades, it typically is desirable to have a luminaire with an individually-replaceable light source, similar to a conventional incandescent or compact fluorescent light bulb in a conventional luminaire. Similarly, it may be desirable for an OLED-based luminaire to incorporate one or more individually replaceable components, such as OLED lighting panels, so that it is not necessary to exchange the entire luminaire if the OLED fails.

In embodiments disclosed herein, a luminaire that includes an OLED lighting panel, an outcoupling component such as a dome, and an index-matching element disposed between the panel and the outcoupling component is described. FIG. 3 shows an example of such a luminaire, such as may be suitable for suspension from a ceiling. The luminaire includes a fixture 310, an emissive component 320, which may include an OLED panel or similar component and/or an index-matching component as disclosed herein. The luminaire also may include an outcoupling component 330, or "outcoupler", as disclosed herein. In various embodiments, one or more of the OLED panel, the outcoupling component, and the index-matching component may each be individually replaceable. In some embodiments, a replaceable component may include two or more of these components. Generally, the dome may provide efficacy enhancement as well as the aesthetic visual effect of magnifying the OLED and changing the angular output of the light. In addition, the dome may magnify the OLED active area, thus reducing the glare at a constant brightness. The use of an outcoupling dome also may reduce the manufacturing cost since a smaller OLED panel may be used. The index-matching element may contain index-matching oil, a gel pad or sheet, a packet containing an index-matching material, or any similar component which provides outcoupling enhancement by filling the air gap between the interface of the luminaire and the OLED substrate. In preferred embodiments, the index-matching element is a self-contained unit, which does not require injection, re-filling, or other processes typically required when an oil would be used alone. The refractive index of the index matching element is substantially the same as that of the outcoupling component, the emissive surface material of the OLED panel, or, more preferably, both. The refractive index of the index matching element may be between 1.4 and 2.0. In addition, the index matching element may be transparent.

Generally, a device such as a luminaire as disclosed herein may include an emissive package that is configured to connect to a luminaire body to form the luminaire. The emissive package may be separately replaceable from other components of the luminaire, and/or individual parts of the emissive package may be separately replaceable from other components of the emissive package. As used herein, a component of a luminaire is considered separately or individually replaceable if it can be replaced without requiring the use of special tools, facilities, or the like, for example by a consumer or other end user of the luminaire. For example, some OLED devices require specialty fabrication or assembly devices to provide or replace various components of the device. In contrast, a separately replaceable component for a device as disclosed herein can be replaced by an end user without requiring more than common tools, such as screwdrivers, pliers, and the like, or, more preferably, without requiring the use of any tools, or any specific tools. Thus, the separately replaceable component disclosed herein may be sold or otherwise provided to end users for use within OLED-based luminaires, without requiring the user to replace the entire luminaire or provide the luminaire to a special-purpose maintenance facility to replace a part such as an OLED panel.

An emissive package as disclosed herein may include an organic emissive component, such as an OLED panel, which may be configured to connect to the luminaire body or to another component of the luminaire, such as a fixture 310 in FIG. 3. An index-matching component may be disposed at least partially opposite the organic emissive component from the luminaire body. The index-matching component and/or the emissive package as a whole may be replaceable separately from an outcoupling component of the luminaire, such as a dome or other component, shown as 330 in FIG. 3. Similarly, the organic emissive component, which may include an OLED panel, may be separately replaceable from the outcoupling component, and each of the index-matching and organic emissive components may be replaceable separately from each other.

The index-matching component may be provided in various form factors, such as a gel pad, a disposable gel packet, a gel sheet, an encapsulated gel or liquid, or the like. A gel may be considered encapsulated if it is contained within a sealed container, such that the container may be handled by a person without coming in contact with the gel. An encapsulated gel preferably may be somewhat flexible, bendable, or otherwise malleable such that it will fill in irregularities in a surface when placed adjacent to the surface and/or held against the surface under pressure. It also may contain index-matching oil or grease on one or more outside surfaces, for example to help fill imperfections in adjacent surfaces. It may contain or be entirely composed from an index matching material. Such materials include, for example, index matching oil, silicone, fluorocarbon or chlorofluorocarbon, methylene iodide or a mixture of arsenic tribromide, arsenic disulfide and/or sulfur, silica or titania sol, which may be dispersed in a liquid organic polymer such as polyvinylalcohol, silicone hydrogel, or any other hydrogel such as polyacrylamide, or the like, and may have appropriate physical qualities to allow for index matching between the emissive component such as an OLED panel, and the outcoupling component. For example, the index-matching material may have a Young's modulus of 0.1 MPa-1 GPa, and/or an index of refraction of 1.4-2.0. The specific index of refraction may be selected to match the outcoupling component and/or an emissive surface material of the emissive component. For example, it may be selected to be within 90% of the index of refraction of one or both components. The emissive surface material of the emissive component may be the substrate of a bottom-emission or transparent OLED panel, such as glass and plastic. Alternatively, the emissive surface material of the emissive component may be the encapsulation layer of a top-emission or transparent OLED, such as glass, thin-film barrier and lamination sheet. In some embodiments, the index-matching component may be or include oil-type index matching materials as previously described. An oil-type index-matching fluid may be naturally thin relative to the other components, and thus does not add appreciable thickness to the entire luminaire. In some cases, the oil-type material may merely fill gaps or irregularities in the surface of the components or between the components, and thus may add no thickness to the device. However, as previously described, the process of introducing the oil-type fluid to the luminaire may require care and precision to prevent from leaving air bubbles between the interface of the OLED substrate and the luminaire. In addition, the fluid may require cleaning process after the filling. Some index-matching fluids also may require hazard caution, such as high-index matching fluids that contain toxic or potentially-toxic materials such as tin iodide. Thus, in embodiments in which an oil-type fluid is used, it may be preferred for the fluid to be encapsulated within a packet or other structure that can be safely and conveniently handled separately from other components of the luminaire.

To avoid the issues that oil-type materials may present when used alone and injected into a device, in some configurations, the index-matching component may be a deformable component that is sufficiently deformable to conform to irregularities in the surface of an OLED panel or other portion of the organic emissive component, and/or sufficiently deformable to conform to irregularities in the surface of the outcoupling component. For example, the index-matching component may include a gel sheet or similar component that can be placed between the emissive component and the outcoupling component. When pressed between the two, the gel sheet may conform to any irregularities in either surface, and thereby provide improved outcoupling between the components.

The outcoupling component also may have any of several form factors, such as a dome, pyramid, parallelpiped, hemisphere, or the like. In general, the outcoupling component can be any shape, such as those used for glass and plastic domes and other structures used in conventional luminaire fixtures. In some configurations, the organic emissive component, e.g. an OLED panel, may have an emissive outline shape that is similar or identical to, or that otherwise matches the cross-section of the outcoupling component in the plane of the organic emissive component. For example, when a hemispherical dome outcoupling component is used, the organic emissive component and/or an OLED panel in the organic emissive component may have an emissive area in circular outline. The outcoupling component may be a transparent component made of transparent materials, such as acrylic or glass. In some embodiments, nanoparticles or powders may be dispersed in the outcoupling component to add a scattering property. In such a configuration, it may be preferred for the refractive index of the nanoparticles and/or powders to be different than that of the main material of the outcoupling component. In some embodiments, the surface of the outcoupling component that is not in contact with the emissive component may be textured or roughened to provide additional scattering effects and/or decorative features.

Advantageously, embodiments disclosed herein allow for the use of an organic emissive component such as an OLED panel that can be substantially smaller than the outcoupling component of a luminaire. The outcoupling component may provide an apparent magnification of the OLED panel, so that the use of a smaller OLED panel at higher brightness may be achievable without introducing excessive or undesirable levels of glare. For example, an OLED panel with an emissive area of about 60-90% of the area of the largest cross-section of the outcoupling component may be used with the OLED still appearing to an observer to fill the outcoupling dome. That is, if the outcoupling component has a cross-sectional area A, the emissive area of the OLED panel used in the luminaire may be in the range of about 0.6 A-0.9 A. For example, if an OLED panel of area 0.6 A is magnified to appear to be of area A when viewed from a distance of, for example, less than 3 m, or a distance in the range 1-5 m, then it may be operated at 1/0.6=1.67 times the glare limit without dazzling the observer. This may allow for smaller and/or brighter OLEDs to be used in general lighting fixtures, which can reduce manufacturing cost and/or complexity. As previously described, the OLED panel may have a pattern that matches the shape of the base of the outcoupling component.

Figure 4:
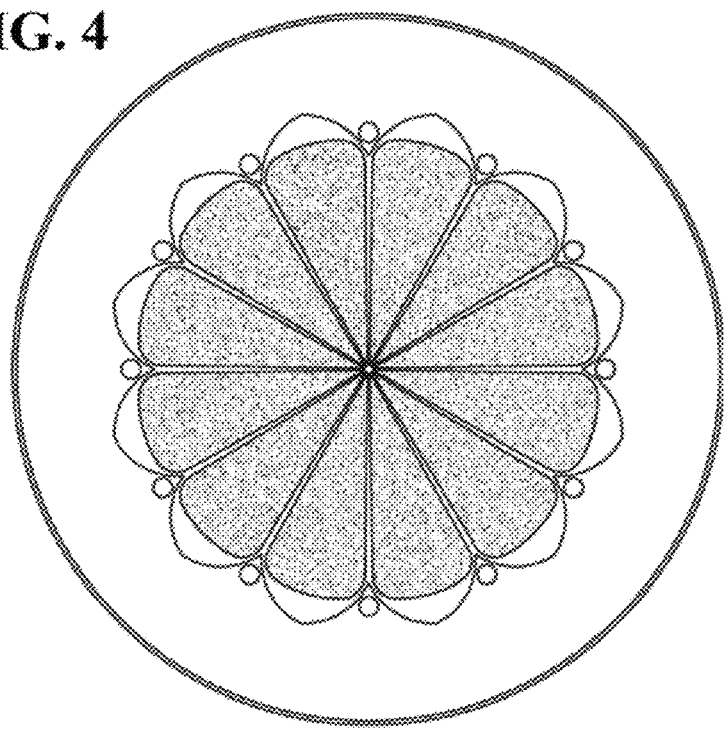
FIG. 4 shows an example pattern layout of an OLED lighting panel according to an embodiment of the invention.

An example luminaire according to an embodiment of the invention is shown in FIG. 4. The OLED luminaire includes a circular OLED lighting panel coupled to a transparent acrylic hemispherical dome using index-matching fluid between the OLED and the dome. The OLED lighting panel has a 4 inch diameter large "citrus pattern" design, including 12 petal-look pixels, as shown in FIG. 4. The stippled surfaces indicate the active area and the surrounding circle represents the outline of the outcoupling dome. Notably, the active area may be smaller than the surface of the outcoupling dome that is coupled to the active area. In some embodiments, the pixels may be connected in parallel, using highly-conductive bus lines. External fuses may be added to each pixel to prevent electrical shorting that may otherwise cause the entire panel to fail. Alternatively, the pixels may be connected in series. In other embodiments, the pixels may be individually addressed and may be selectively lit up to provide aesthetic effects. The total active area of an example panel fabricated as shown is 72.8 cm$^2$, but generally any size pixels and panels may be used with embodiments disclosed herein.

Figure 5:
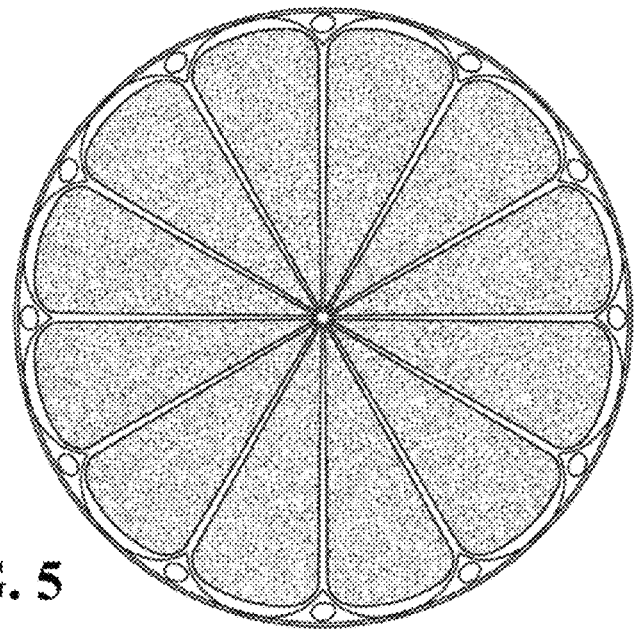
FIG. 5 shows an enlarged bottom view of an example pattern due to an optical effect introduced by an outcoupling component according to an embodiment of the invention.
Figure 6:
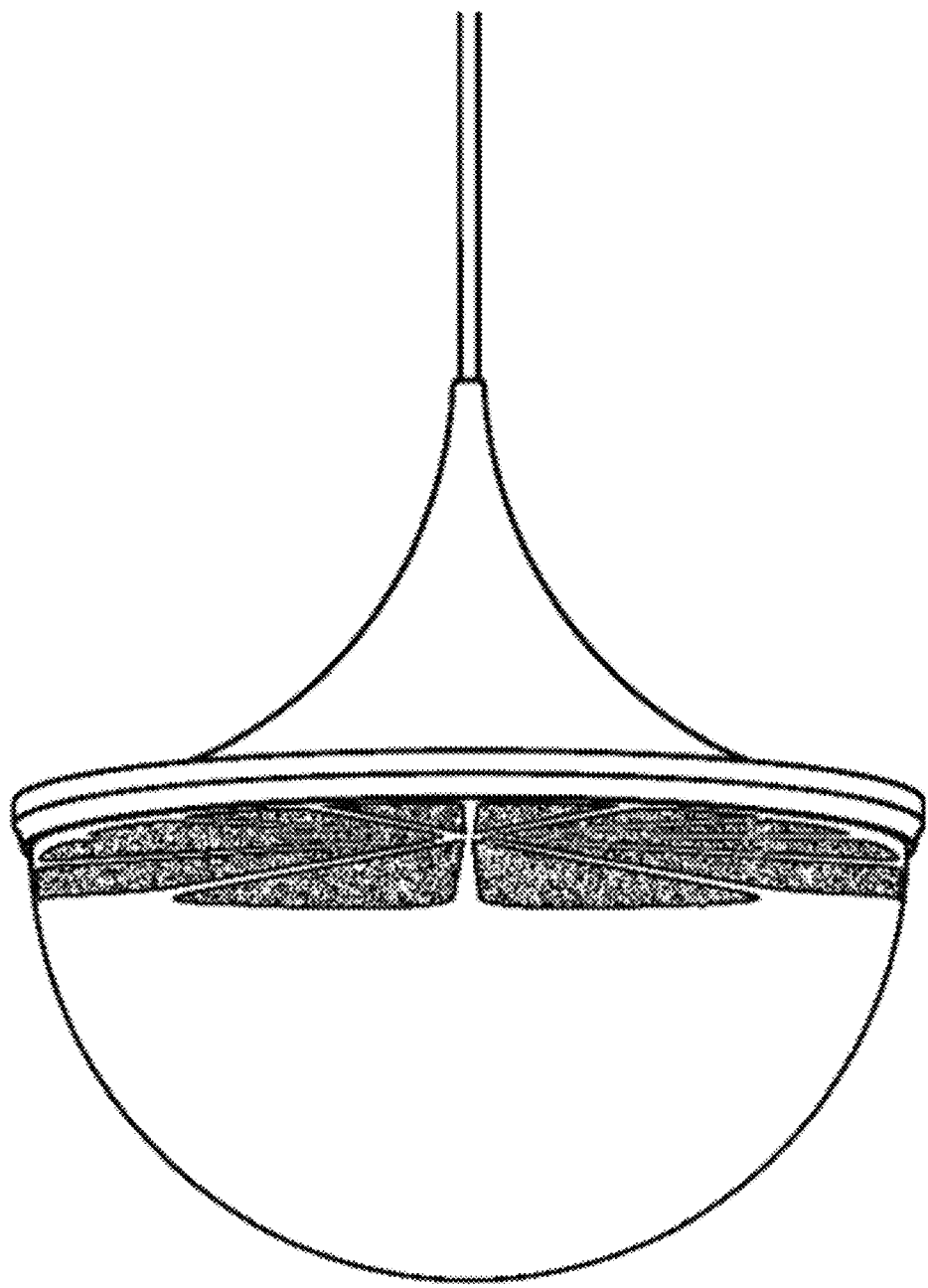
FIG. 6 shows a side view of a distorted pattern of an example OLED lighting panel due to an optical effect introduced by an outcoupling component according to an embodiment of the invention.
Figure 7A:
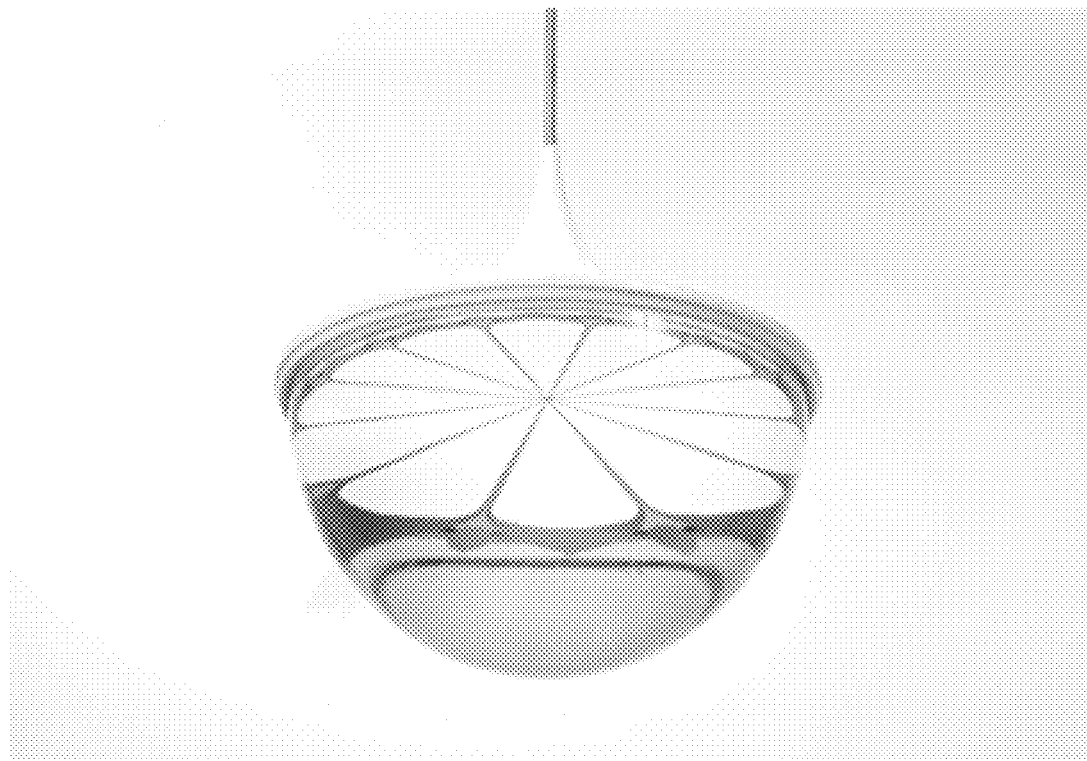
FIG. 7A shows a photo image of an example light fixture from an off-angle view.
Figure 8:
FIG. 8 shows a photo image of an example light fixture where the emission light appears green and/or pink at a large viewing angle.

In addition to outcoupling enhancement, the use of a dome or similar outcoupling component also may provide optical effects such as enlarging the pattern of the OLED itself, distorting the pattern, causing varied color at different viewing angles, and the like. In the example device, by adding the 6 inch dome on top of the 4 inch lighting panel, the original panel was visually enlarged to a 6 inch illumination area, as illustrated in FIG. 5. In addition, when viewed at an off angle, the petal pattern appears distorted, as shown in FIGS. 6 and 7A. Such distortion may be used to provide a decorative feature. The panel also demonstrates prismatic effects such that at normal incidence, the panel emits substantially white color, while at a large viewing angle, the panel appears pink or green hue as shown in FIG. 8. By designing the OLED structure, panel layout and the luminaire shape, various visual effects may be achieved, which makes the panel more visually attractive.

Figure 9:
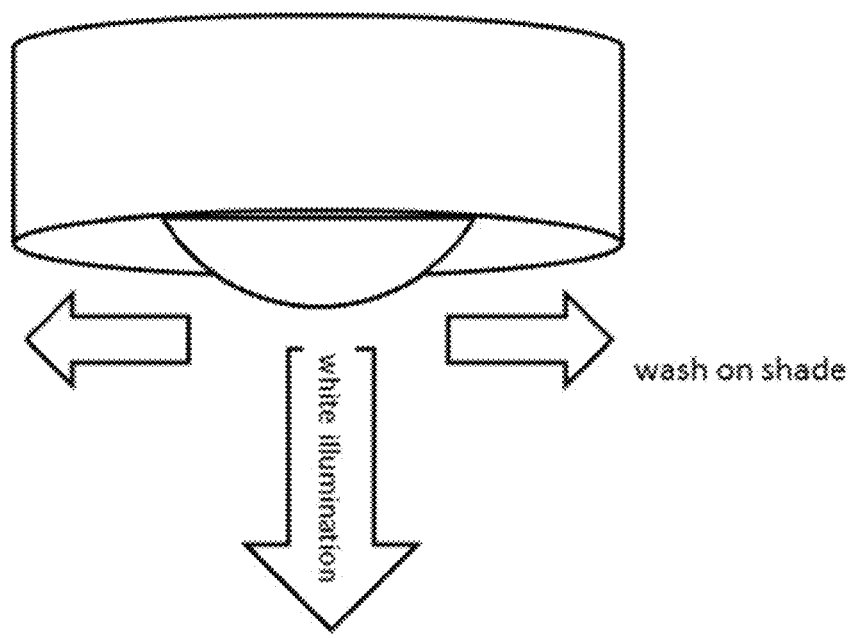
FIG. 9 shows an example dome outcoupler surrounded by a cylinder of white or neutral material according to an embodiment of the invention, so that substantially white light is emitted downwards while a color wash appears on the cylinder.
Figure 10:
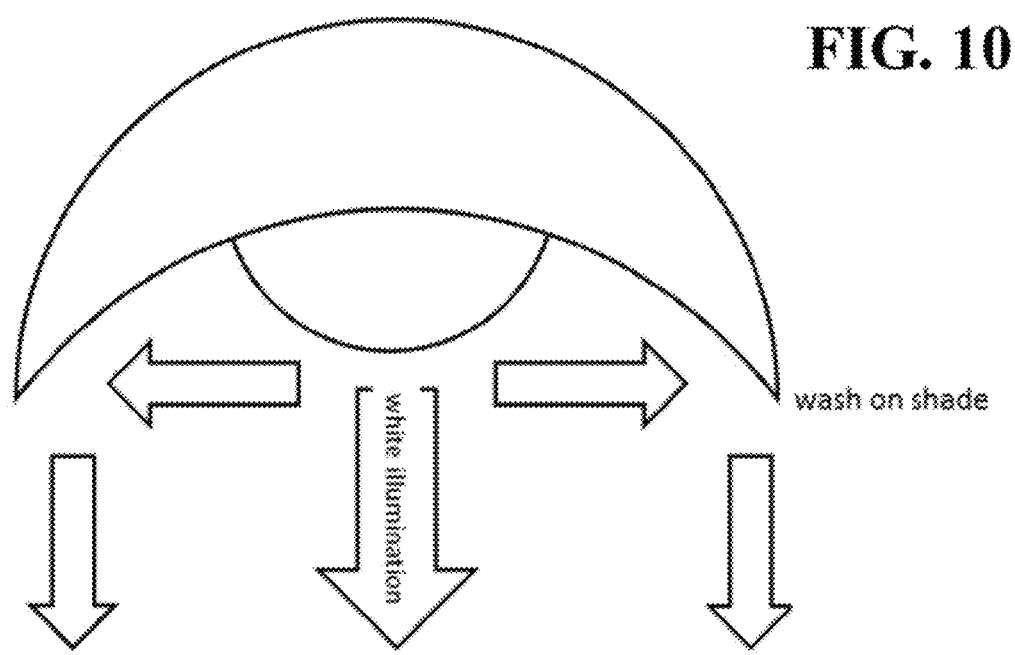
FIG. 10 shows an example dome outcoupler surrounded by a curved reflective component, which receives a color wash from the outcoupler and redirects some of it in a downwards direction according to an embodiment of the invention.

The color dispersion that may be caused by an outcoupling component as disclosed herein may be used for various visual effects. In some embodiments, it may be used to apply an attractive colored "wash" to a surrounding surface. For example, if the luminaire is to be mounted to a ceiling, the colored wash may appear on the top of the surrounding wall and/or on portions of the ceiling near the luminaire. However, in some cases the wall may be relatively distant from the luminaire, in which case the color might be too faint to perceive. Therefore, a configuration as shown in FIG. 9 may be used, in which a surrounding surface is placed relatively close to the OLED panel to provide a specular or diffuse reflective surface for the color wash, while allowing white light to be emitted downward from the luminaire, such as to illuminate a work surface below the fixture. A similar configuration is shown in FIG. 10, in which a curved specular or diffuse reflector surrounds the dome to both receive the color wash and reflect some of it down to the work surface, allowing for further tuning of the quality of light below the dome.

An example treatment of a hemispherical dome at an on-axis viewing angle is provided in further detail herein. More generally, the outcoupling component may be of any shape, and may correspond to the pattern layout of the OLED panel. For example, an OLED panel having one or more triangles may be attached to a pyramid-shape outcoupling component. Indeed, both the pattern of the panel and the shape of the outcoupling component may be designed according to both the decorative and outcoupling effects of the component. The outcoupling component may have substantially the same dimension as that of the OLED panel, i.e., the surface of the outcoupling component that is adjacent to the OLED panel may have the same or about the same shape as the OLED panel, or as a set of OLED panels used in the luminaire. More preferably, the outcoupling component may have a dimension larger than the panel, to offer mechanical support as well as higher outcoupling enhancement as disclosed herein. In some embodiments, the dome may have a recessed portion in which the OLED panel or, more generally, an emissive component of the luminaire, may be disposed when the luminaire is assembled. The outcoupling component may be solid, or it may be a hollow shape with a relatively thick shell. For example, the outcoupling component may have a thickness of at least 5 mm.

As previously discussed, when an oil-type index matching material is used, care is taken when filling the gap between the OLED substrate and the outcoupling component, because small air bubbles that might be introduced will be magnified by the dome and will spoil the aesthetics of the luminaire. Also, in such a configuration the emissive component, such as an OLED panel, typically is permanently attached to the outcoupling component using a glued edge seal. For these reasons, the process of replacing the OLED panel—for example, at the end of its operating life—may not be appropriate for the end-user.

Figure 16:
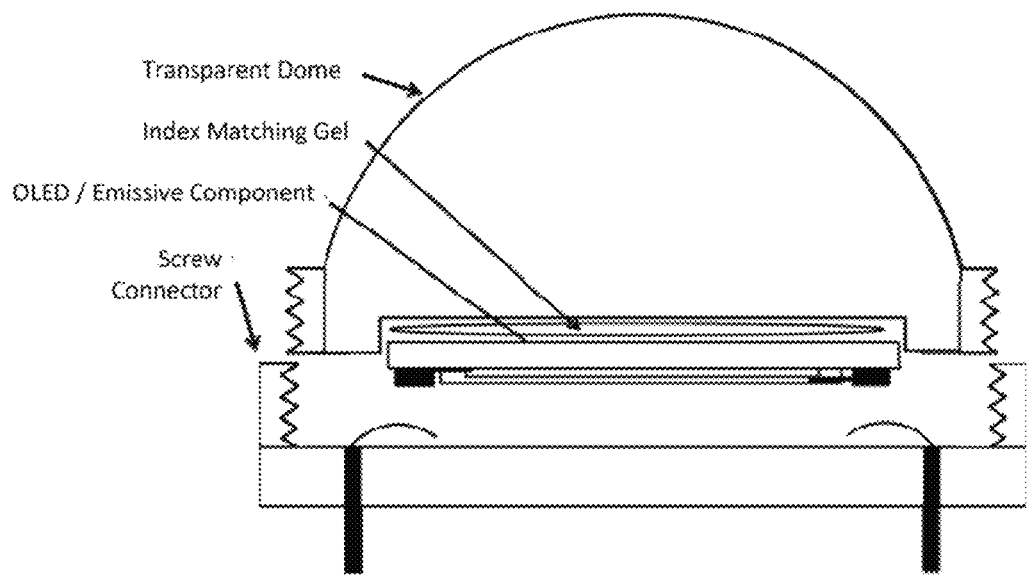
FIG. 16 shows an exploded view of a luminaire with a replaceable index-matching component prior to assembly according to an embodiment of the invention.
Figure 17:
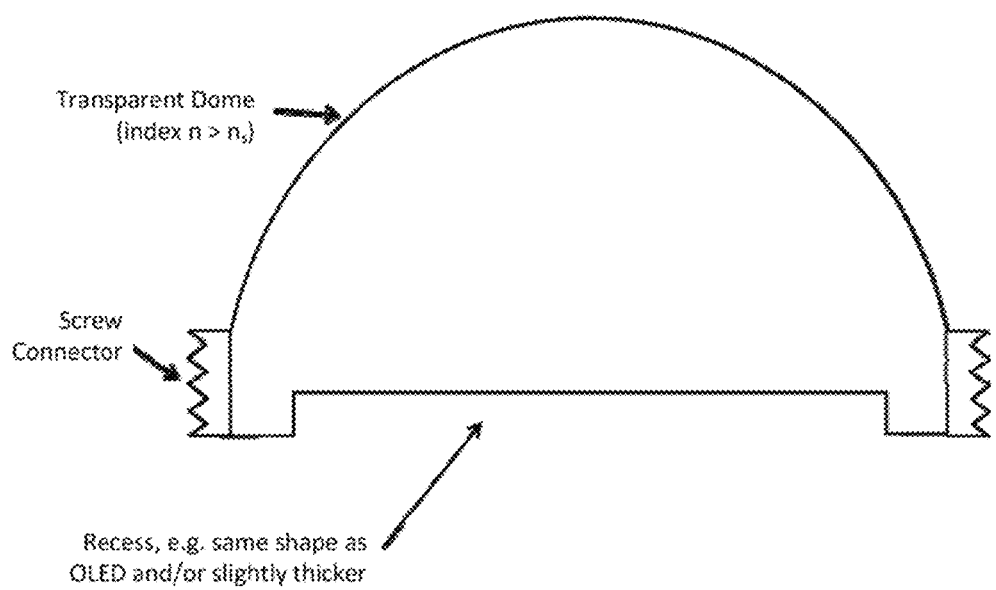
FIG. 17 shows a hemispherical outcoupler used to enhance total outcoupling from the OLED and the aesthetics of the lamp by making the angular distribution of the light broader than a Lambertian distribution according to an embodiment of the invention.

To avoid these issues, in an embodiment the OLED panel may be easily replaceable, and/or it may be replaceable separately from other components of the luminaire. For example, the OLED panel may be reversibly clamped to the dome using a screw or clamp device, such as is shown as an exploded schematic in FIG. 16. An example outcoupling device is shown in FIG. 17, and an example of a corresponding emissive component including an OLED panel is shown in FIG. 18. The OLED may be grown on a rigid or flexible substrate of refractive index $n_s$. The OLED may be encapsulated, with anode and cathode contacts passing through the encapsulation so that external electrical contact can be made to provide a drive signal to the OLED. In some embodiments the substrate may be further roughened to provide scattering effect and hence to improve the outcoupling efficiency. As previously noted, any OLED structure may be used, such as a bottom emission device, a top emission device, a transparent OLED, or combinations thereof. A dome-shaped outcoupling component is shown for purposes of illustration. As previously described, any shape may be used for the outcoupling component, and the specific size and shape of the outcoupling component may be matched to the size, pattern, and/or shape of the OLED panel.

The OLED panel may be secured to the outcoupling component using a screw-threaded fixture such as that shown in FIG. 19. In this example, spring contacts on the fixture make electrical connections with the anode and cathode contacts connected through the encapsulation of the OLED. Thus, the light emitting side of the OLED is disposed toward the outcoupling component, and the opposite side of the OLED is in contact with electrical connections which in turn connect to an electrical outlet. The electrical connection may include an Edison screw fitting, a bayonet fitting, an arrangement of plugs designed to mate with an electrical socket, or any other appropriate connection as will be readily appreciated by one of skill in the art. In other configurations, a clamping mechanism may be used instead of, or in conjunction with, a screw thread. More generally, any method of securing the OLED emissive component between the fixture and the outcoupling component may be used.

As previously described, an index-matching component may be disposed between the OLED panel and the outcoupling component to ensure efficient outcoupling. For example, an index-matching gel pad may be placed between the outcoupling and emissive components of the luminaire. Such a gel pad may be supplied with a replacement OLED, and may be separately packaged such as within a sealed packet to prevent drying out. It may be preferred for the gel pad to be made from a cross-linked polymer, where the degree of polymerization and cross-linking is adjusted to give the gel pad sufficient structural integrity to permit it to be removed from a package and placed on the outcoupling component, while simultaneously being sufficiently flexible and ductile to flow into any defects that might exist in the OLED emissive surface or outcoupler surface, thus filling the space between the OLED and the outcoupler with material of the same refractive index as the outcoupler. Two example embodiments of the gel pad are cross-linked polyvinyl alcohol (PVA) with, for example, a sodium borate cross-linking agent, or a silicone gel. Both these materials typically have a refractive index slightly below 1.5. As previously described, it may be preferred for the refractive index of the gel pad to be equal or about equal to that of the outcoupling component, and equal to or greater than that of the OLED emissive surface. In some embodiments, a scattering element, such as $TiO_2$ nanoparticles or other high-index powders, may be dispersed in the gel pad before or during the crosslinking process. If a high-index substrate and outcoupler are used, adding high-index nanoparticles may also help to increase the refractive index of the gel to match the substrate and/or the dome. The viscosity, and therefore structural integrity, of the gel pad may be adjustable by varying either the degree of polymerization of the PVA or silicone or the degree of cross-linking Techniques to accomplish either these goals are well known in the art.

The variability of these properties and the use of filler allows for the fabrication of a gel pad that is sufficiently rugged to be removed from a shipping package and placed between a new OLED panel and an outcoupler, while being sufficiently flexible and ductile to flow into all defects, or all but the very smallest defects, in the outcoupling component. It may be preferred for the gel pad to be circular in shape and slightly thicker in the middle than at the circumference. This may allow air to be naturally excluded from the structure as the OLED panel is clamped between the outcoupler and the fixture. In other embodiments, the outcoupler may not be hemispherical, instead having a cylindrical or a more complex three-dimensional shape. In such configurations, the gel pad may be designed to reflect the shape of the emissive component or the OLED panel. It may be preferred that, in its uncompressed state, the gel pad is slightly smaller in area than the OLED and slightly thicker in its middle than at its circumference, so that air is naturally excluded as the OLED is clamped between the fixture and the outcoupler. When the clamp is tight, however, the gel pad may be compressed so that it is of substantially uniform thickness, filling all irregularities between the OLED substrate and the outcoupler, and matching the refractive index of the outcoupler. If the OLED is designed to fit into a recess in the outcoupler as previously described, then the gel pad may provide resistance to further compression when it completely fills the space between the OLED substrate and the outcoupler, providing tactile feedback for the consumer to stop tightening the fixture. An example embodiment of a gel pad as disclosed herein is shown in FIG. 20. In some embodiments, the gel pad may have oil on its surface to promote good optical contact with the outcoupler and the OLED.

Figure 21:
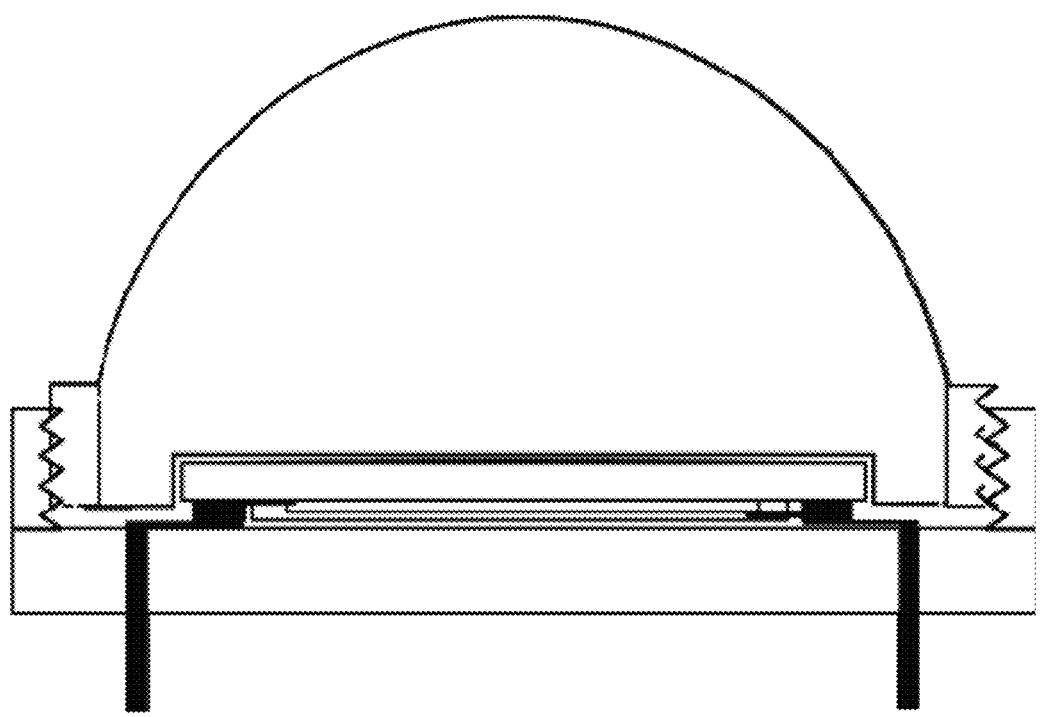
FIG. 21 shows an assembled luminaire with a gel pad according to an embodiment of the invention.

An example of a final assembled lighting fixture using components such as shown in FIGS. 16-20 is illustrated in FIG. 21. In order to provide an efficient outcoupling effect, the surfaces of the panel substrate and the outcoupler may need to be cleaned prior to assembling to remove any particles or dust in the interface that may affect the outcoupling efficiency, and whose presence may be optically magnified by the luminaire and affect the visual appearance of the luminaire.

Figure 22:
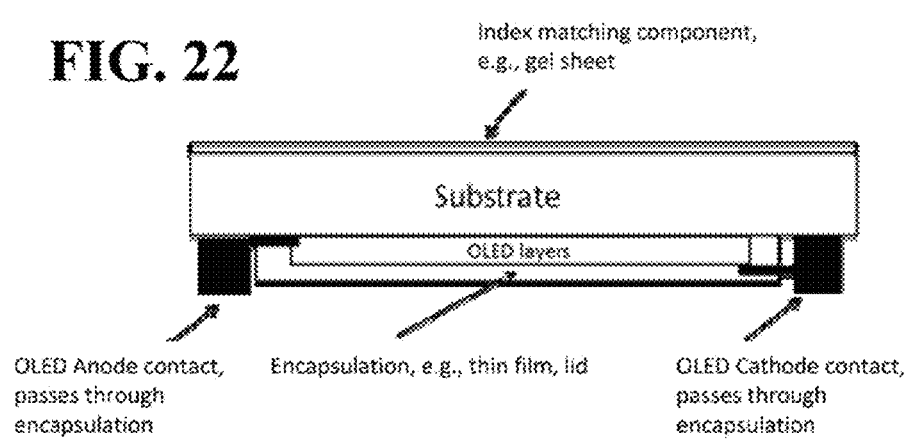
FIG. 22 shows a separately-replaceable emissive component with an incorporated index-matching gel sheet according to an embodiment of the invention.

In an embodiment, the index-matching component may be or include an index-matching gel sheet with the same or about the same dimensions as the OLED panel. The gel sheet may be permanently or semi-permanently attached to the panel, such as to the substrate, as shown in FIG. 22. In such a configuration, a disposable emissive component or OLED panel may be sold with the gel sheet attached as a whole part. When packaged, the emissive component may have a liner disposed over the gel sheet to prevent the surface from attracting dust or particles, which then may be removed by the customer prior to assembling the emissive component with the fixture. Alternatively or in addition, the outcoupling component also may include an index-matching gel sheet that is attached to surface that will be in contact with the OLED panel when the luminaire is assembled. The gel sheet attached to the outcoupling component also may have a liner to keep the surface free of particles.

Figure 23:
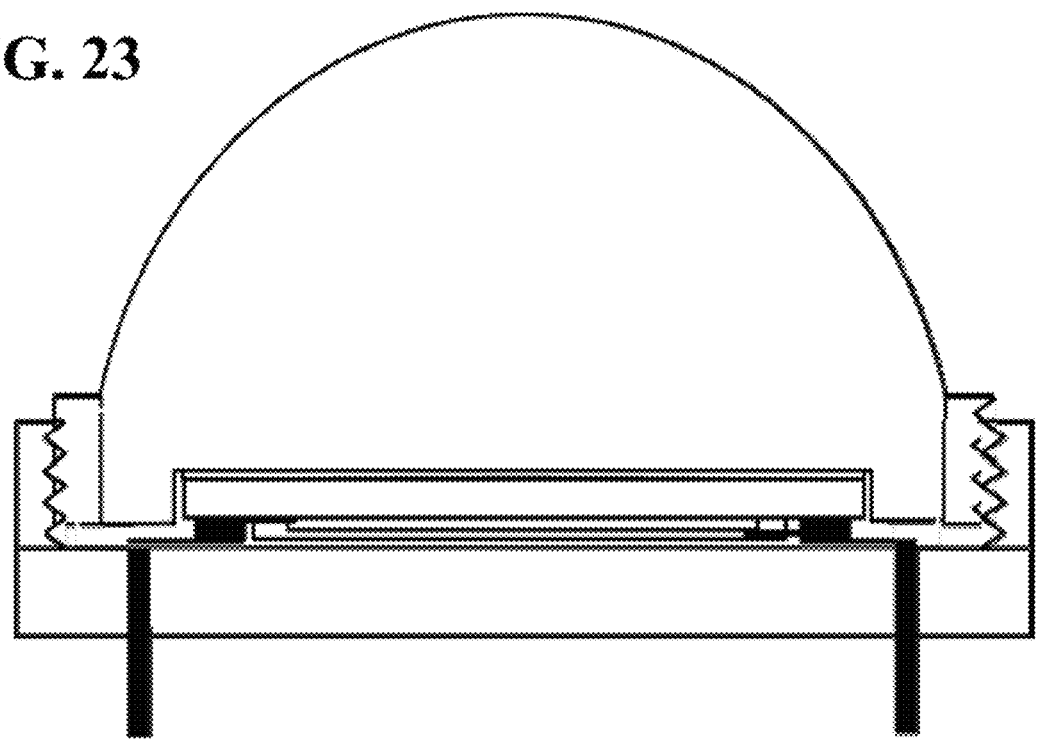
FIG. 23 shows an example assembled luminaire according to an embodiment of the invention.

The luminaire may be assembled in a fashion similar to that described with respect to FIGS. 16-20. For example, the emissive component including an OLED panel may be attached to the luminaire, such that the index-matching gel may be placed in contact with the surface of the outcoupling component and provide an air-free tight contact after screwing the clamps, as shown in FIG. 23. One advantage of using a permanently attached gel sheet instead of a separate gel pad may be that the surface of the panel substrate may be kept particle free and the cleaning step may be eliminated during assembling. In addition, the assembling process also may be simpler with one less part involved, i.e. the separate gel pad. Notably, the emissive component including OLED panel and gel sheet may be replaceable separately from other components of the luminaire, such as the outcoupling component, the fixture, and/or any other connections or components.

The use of a non-fluid index-matching component may have two potential limitations. First, the outcoupling efficiency of an OLED panel sealed to an outcoupling component using a gel pad may not be as high as the same OLED sealed with an index-matching fluid in the air space because the gel may not be able to fill the smallest imperfections in the OLED and/or outcoupler surfaces to the same extent as a low-viscosity fluid. However, in most or all cases the loss is expected to be less than 10%, leading to a negligible impact on performance. Similarly, a device sealed with a gel pad may not be as aesthetically pleasing as one sealed with an index-matching fluid because of small air bubbles which could be magnified by the outcoupling component. These limitations may be removed or minimized by optimizing the viscosity of the gel pad, such that it can fill small imperfections in the adjacent surfaces while still having sufficient structural integrity to allow for a consumer to remove it from a packet and install it in a fixture as described herein. In some embodiments, the limitations may be reduced or eliminated by coating the surface of the gel pad with oil. Further, additional scattering particles may be dispersed in the gel to enhance outcoupling effects.

The use of an index-matching component as disclosed herein, which may be disposable, shaped, and/or replaceable separately from other components of a luminaire may enable high efficiency and aesthetically pleasing OLED devices to be supplied to the consumer at far lower cost than would be achievable if the entire luminaire were to require replacement every time the OLED panel failed.

An additional feature of lighting fixtures as disclosed herein includes the ability to "mix-and-match" the OLED panel and the outcoupler. As discussed above, in many embodiments, the OLED panel may have various shapes and/or patterns, as may the outcoupler. Therefore, the use of a separately replaceable light emitting control the fixture may provide the consumer with the opportunity to select the panels and luminaire based on their own preference.

Experimental and Modeling

An example device as shown in FIG. 4 was fabricated on 4 inch diameter soda lime glass with a refractive index of approximately 1.5. In some embodiments, the panel may be fabricated on a high-index glass, e.g. with a refractive index of about 1.79. The use of higher-index glass may, for example, improve the extraction of internal organic/anode waveguided modes into the substrate. A bottom-emission white OLED structure was used in the example device. More generally, any OLED structure may be used with embodiments disclosed herein. The OLED lighting panel was attached to a transparent outcoupling component. In the example device, a 6 inch diameter transparent acrylic hemisphere with a refractive index of about 1.5 was attached to the emission surface, i.e. the other side of the glass substrate from the OLED, to enhance the light extraction. In some configurations, when the OLED is built on a high-index glass substrate, the outcoupling component also may be made of glass with the same index or a similarly high index. The refractive index also may vary from one end of the outcoupler to the other. In general, the refractive index of the outcoupling component is preferred to be the same, or close to that of the OLED substrate, or the encapsulation material. Alternatively or in addition, nano particles such as $TiO_2$ may be dispersed into the outcoupling component so as to scatter light. For example, nano particles may be disposed within the outcoupling component, a portion of the emissive component, or combinations thereof. In some embodiments, to effectively couple light from the OLED out through the dome, the gap between the OLED and the dome may be filled with index-matching fluid. The use of an index-matching fluid may effectively mask irregularities in the flat surface of the dome and/or the emissive surface of the OLED panel that might otherwise prevent efficient optical coupling between the OLED and the dome.

Figure 7B:
FIG. 7B shows a photo image of an example light fixture from a side view.

The example device shown in FIG. 4 was constructed and the efficacy and chromaticity of the panel with and without the dome were measured inside a 20" integrating sphere. Detailed panel performances are summarized in the table below. Efficacy enhancement was compared at the same luminance level. As shown, the use of the outcoupling dome provides an efficacy enhancement of up to a factor of 2×. It also may lead to a low operational temperature and therefore improve the device lifetime. The exact efficacy values and chromaticity performance may depend on the device structure and in general the specific values are not important for comparison purposes, so long as the efficacy enhancement is compared at the same luminance. The panel attached with the dome was assembled into a fixture and to form a luminaire, as illustrated in FIG. 3. The fixture includes a curved top shell 310, a retaining ring, within which may be disposed an emissive component 320 such as an OLED panel, and an outcoupling dome 330. In the example device, the OLED panel is permanently attached to the dome using a glued edge seal. FIGS. 7 and 8 show photo images of the example luminaire.

A summary of the white OLED lighting panel performance with and without the dome at 1,000 $cd/m^2$ (equivalent to 23 lm total light output) and 3000 $cd/m^2$ (equivalent to 69 lm total light output) is shown below. Data was measured inside a 20" integrating sphere. Efficacy enhancement was compared to the same luminance level.

|  | Without dome | With dome | Without dome | With dome |
| --- | --- | --- | --- | --- |
| Total light output [lm] | 22.7 | 22.8 | 68.3 | 68.5 |
| Voltage [V] | 4.14 | 3.82 | 4.87 | 4.42 |
| CIE (x, y) | (0.420, 0.405) | (0.427, 0.403) | (0.433, 0.408) | (0.440, 0.405) |
| CCT [K] | 3320 | 3160 | 3100 | 2960 |
| CRI | 78 | 78 | 80 | 80 |
| Duv | 0.003 | 0.001 | 0.002 | 0.000 |
| Efficacy [lm/W] | 32 | 66.7 | 25.4 | 55.4 |
| Efficacy enhancement | — | 2.08× | — | 2.18× |

Figure 11:
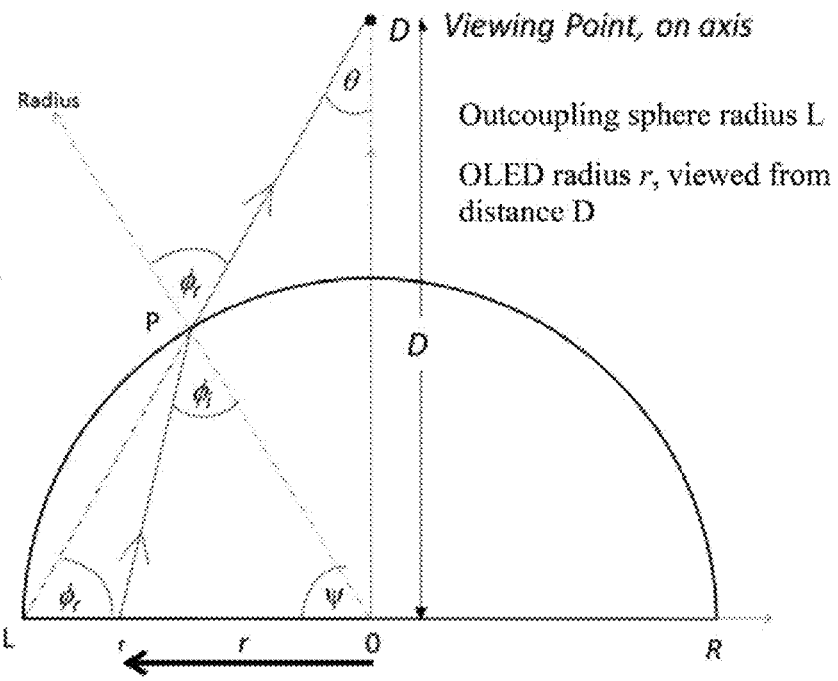
FIG. 11 shows a model calculation of OLED size according to an embodiment of the invention, to provide an appearance that the OLED fills the outcoupler from a certain viewing distance.
Figure 12:
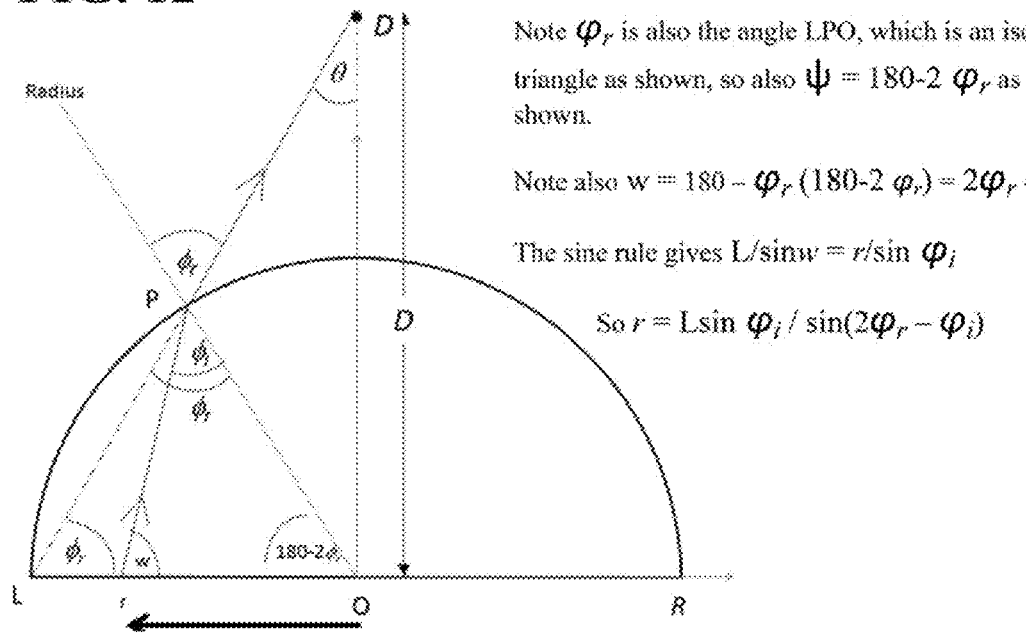
FIG. 12 shows the development of the model from FIG. 11, including relevant angles and lengths.

Various modeling techniques may be used to quantify the magnification effect of an outcoupling component such as a dome, and to relate this to the optimum ratio between the size of the OLED and the size of the dome to maximize the outcoupling efficiency. Here, we use a circular shape OLED panel as an example. More generally it will be understood that other shapes of OLED panels and/or outcouplers may be used, with similar effects and results. First, the radius r of an OLED that would appear to fill the dome when viewed from a point on-axis at a distance D from the base of the dome is calculated as shown in FIG. 11. The ray $r_{PD}$ originates at the point r on the circumference of the OLED and exits the sphere at point P. The ray $r_{PD}$ appears to originate from the circumference of the sphere when viewed from point D. The angles of incidence and refraction (with respect to the normal) are $\phi_i$ and $\phi_r$, respectively. Using this construction, it is possible to determine r as a function of D. As shown in FIG. 12, because they are opposite angles of the intersection of two straight lines, the angle LPO is also $\phi_r$. It is also apparent that the triangle LPO is isosceles, so the angle OLP is also $\phi_r$. Then it follows that $y=180-2\phi_r$ and $w=180-\phi_i-\psi=2\phi_r-\phi_i$ as shown. Then, by the sine rule, $L/\sin w = r/\sin \phi_i$ so $$r = L \sin \phi_i / \sin(2\phi_r - \phi_i) \quad (1)$$

Finally, Snell's law gives $n \sin \phi_i = \sin \phi_r$. Substituting this into Eq. 1 and using trigonometric identities allows for an analytical solution for r, (the desired OLED radius) in terms of L (dome radius), n (dome refractive index) and D (viewing distance). Alternatively, the equation can be solved in steps numerically, as shown in FIG. 13.

Figure 13:
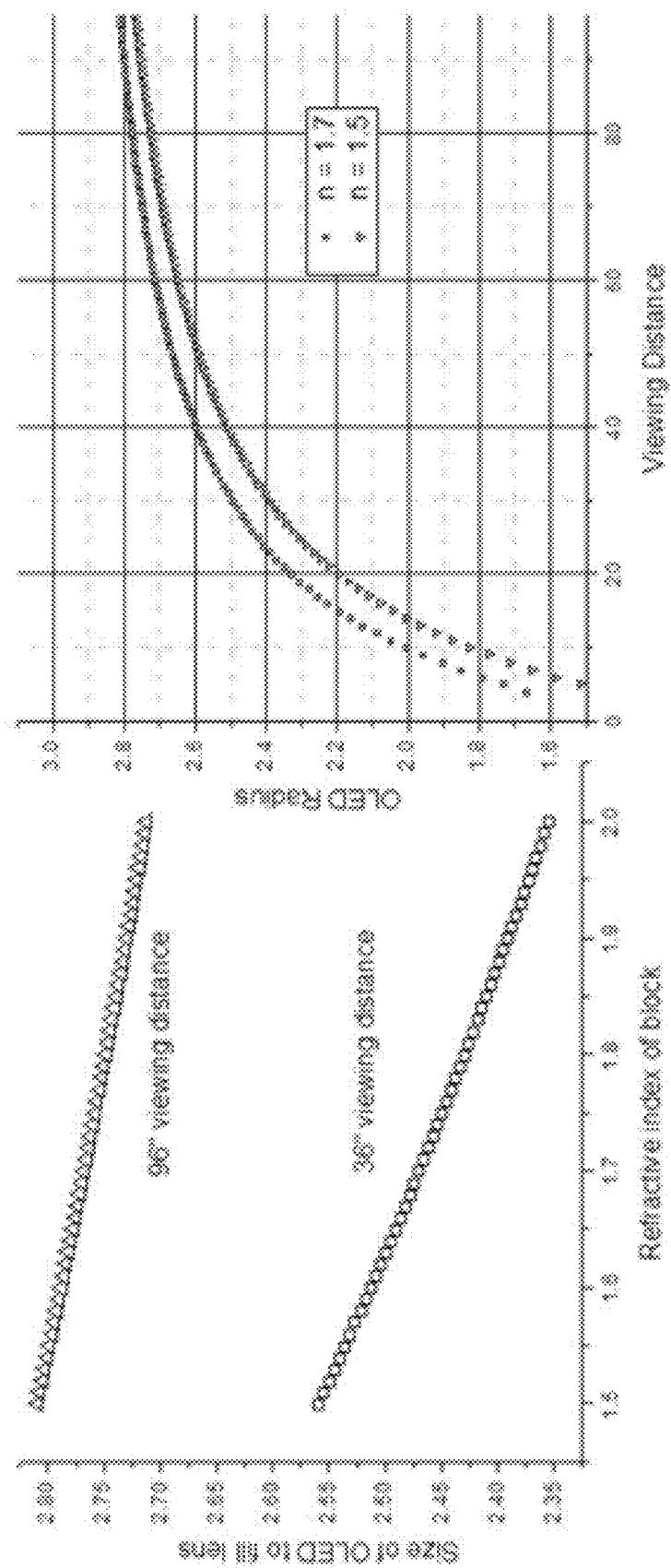
FIG. 13 shows results of the model of FIGS. 11 and 12 including the radius of OLED required to fill the dome as a function of dome refractive index at two viewing distances (left) and the radius of OLED required to fill the outcoupler as a function of viewing distance at two refractive indices (right).

FIG. 13 shows numerical results of this model. The left graph shows the dependence of r on the refractive index of the dome n for two viewing distances; 96" (a standard eight foot ceiling viewed from the floor) and 36" (standard ceiling viewed from five feet high). For the fabricated example device previously described with respect to FIG. 4, the refractive index of the dome was 1.5, matched with a standard soda lime glass substrate. For a viewing distance of 36", a 2.55" radius OLED would be used in a 3" radius dome. The OLED would then appear to fill the dome. A higher refractive index for both the substrate and the dome may further improve the outcoupling and permit a smaller OLED.

The right graph of FIG. 13 shows the dependence of the OLED radius on viewing distance for circular domes of refractive indices of 1.5 and 1.7, respectively. It is apparent that for a lamp optimized for viewing distances between 36" and 60", the optimum radius of an OLED in a dome of radius 3" typically is between about 2.4" and 2.6". This model describes viewing from a point along the axis of the dome. Calculating off-axis points may become extremely complex, such that it may be difficult or impossible to optimize the design for all viewing angles.

A side-effect of designing the OLED so that it appears to fill the dome is that this design rule may represent the optimum outcoupling efficiency of the system. Using an OLED panel larger than the optimum may result in light from the outer annulus of the OLED being totally internally reflected from the curved surface of the outcoupling component, and therefore lost in undesirable directions. To demonstrate this effect, simulations were performed using TracePro 3.3 ray-tracing software from Lambda Research (Littleton, Mass.). The light source was represented by a disc located at the center of the flat surface of the hemispherical luminaire. The hemisphere was 150 mm in diameter and the disc was variably sized. One hundred thousand rays were traced through the dome from evenly distributed random starting points on the disc. The trajectories of the rays were stochastically chosen to represent either a Lambertian or uniform distribution of light from the disc into the dome. The index of refraction of the dome was either n=1.5 or 1.7. The dome material was assumed to be perfectly transparent.

Figure 14:
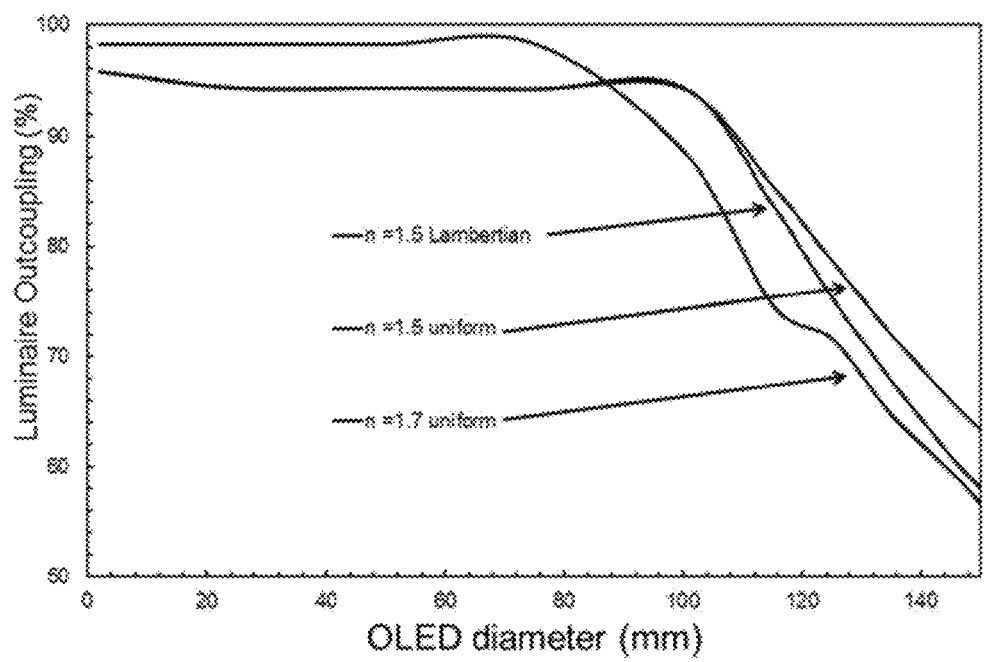
FIG. 14 shows an outcoupling efficiency as a function of OLED diameter for outcoupler refractive indices of 1.5 and 1.7 and for isotropic and Lambertian OLED emission into the outcoupler according to an embodiment of the invention.

When a light ray crosses the dome to air interface, it splits into specularly reflected and transmitted beams with relative intensities governed by the Fresnel Equations. The path of the refracted beam obeys Snell's law. The flat surface of the dome is a specular mirror with 80% reflectivity. The remaining 20% of incident light energy is absorbed. The reflector covers both the light source and the surrounding annulus. Light outcoupling is expressed by the fraction of light emitted into the hemisphere from the disc that leaves the hemisphere at its air interface. This number is calculated by summing the strengths of the rays that have passed from the dome and into the air. The outcoupling results are shown in FIG. 14. For a 150 mm (6") diameter dome, the outcoupling efficiency falls off significantly when the OLED diameter increases above 100 mm, which is close to the point at which the OLED appears to fill the dome from most viewing distances. There is a small dependence on the angular output from the OLED itself, which will depend on the refractive index mismatch between the OLED substrate and the dome (if any) and also a variety of weak microcavity effects caused by the device structure of the OLED itself. The limiting cases of Lambertian emission and uniform (isotropic) emission are shown in FIG. 14. Also, results are shown for domes with refractive indices of 1.5 and 1.7, corresponding to the magnification data shown earlier.

Figure 15:
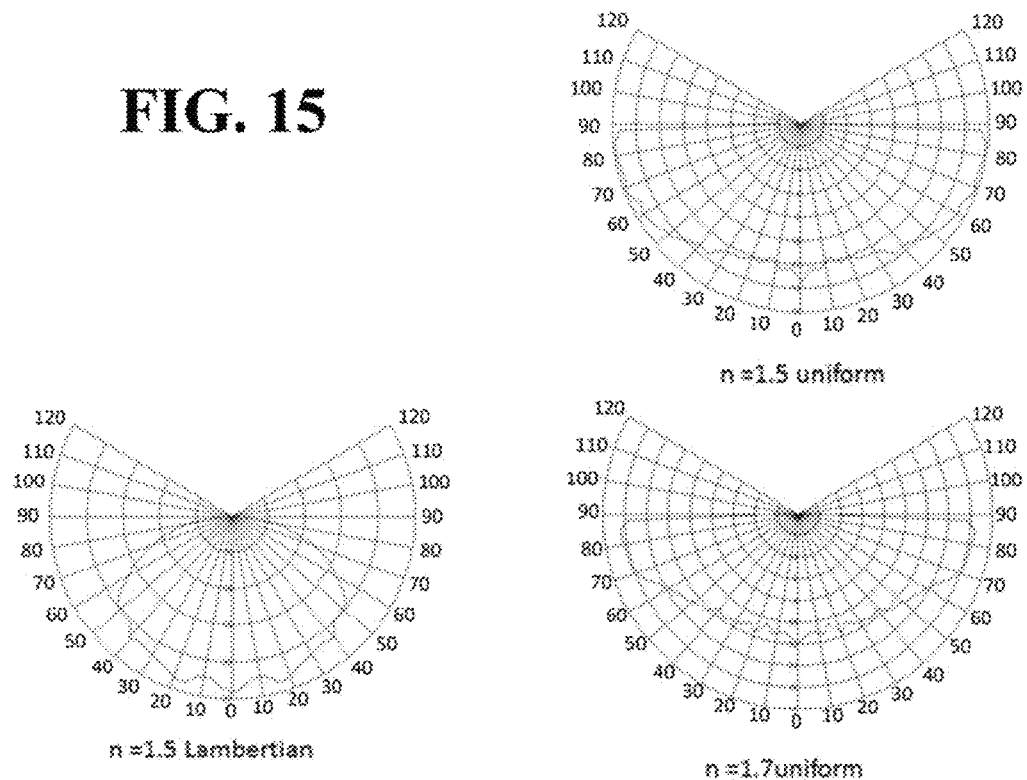
FIG. 15 shows an angular dependence of light intensity emitted for a 100 mm diameter OLED in a 150 mm diameter outcoupler for outcoupler refractive indices of 1.5 and 1.7 and for isotropic and Lambertian OLED emission into the outcoupler according to an embodiment of the invention.

FIG. 15 shows the detailed angular emission profiles for the three devices with OLED panel diameters of 100 mm. As shown, while the total outcoupling efficiency is only slightly affected, the angular emission profile is quite profoundly affected by whether the OLED is a Lambertian or isotropic emitter. In the latter case, much more luminance is emitted at higher angles, which may be desirable for general illumination applications. Again, the Lambertian approximation most closely applies when the OLED emits into a volume with a lower refractive index than the OLED layers, whereas the isotropic approximation most closely applies when the OLED emits into an index-matched volume. For illumination applications requiring high brightness over a wide area, therefore, it may be preferred to use an outcoupling component having a refractive index similar to, as close as possible to, or higher than, the OLED panel. For a more focused beam, however, it may be preferred to use an outcoupling component having a lower refractive index than the OLED layers.

The hemispherical dome shape modeled herein is just one example of possible outcoupling component shapes, and many other curved shapes may be used. Example outcouplers suitable for use with embodiments disclosed herein are also described in detail in U.S. Patent Publication No. 2012/0161610, which is incorporated by reference in its entirety. The optimal OLED radius may be different for these different shapes, though generally it may be advantageous and possible for the OLED panel to be smaller than the outcoupler by about 10%, as illustrated by this analysis. In some embodiments, it may be preferred to use an "ellipsoidal" outcoupling component, i.e., one that has at least one curved surface that preferably is symmetric around a reference point or axis of the OLED panel. Such outcoupling components may be, for example, partially rectangular at the base where they come in contact with the emissive component and curved outward, and/or may have no sharp angles or corners. The curved portion of the outcoupling component may have a cross-sectional shape that matches a shape or pattern of the OLED panel as previously described. In other embodiments, an ellipsoidal outcoupling component may have no rectangular portion, such as where a hemispherical, hemielliptical, or similar outcoupler is placed in contact with the emissive component at a flat base of the outcoupling component.

The luminaires and other devices disclosed herein may be used as light sources for decorative or general lighting. Outcoupling components as disclosed also may function as an anti-glare mechanism, thus permitting the use of smaller and brighter OLED panels than would otherwise be acceptable. This is because a light intensity above about 3000 cd/m$^2$ typically causes dazzle to the eye, which is undesirable. Such dazzle often is reduced by using a diffuser or troffer arrangement. However, using an outcoupler as disclosed herein to magnify the OLED by a factor M may cause a reduction in the apparent OLED brightness by an equivalent factor M without changing the overall light output (i.e., the total lumen level). Since smaller, brighter OLEDs typically are less costly to manufacture, this represents an effective cost savings, especially for phosphorescent OLEDs which are capable of achieving particularly high brightness. For example, as shown in the example data provided herein, a dome outcoupler with radius 3" appears completely filled by an OLED of radius 2.55", representing a saving of 28% in substrate area. Domes of higher refractive index also may result in higher savings.

Aesthetically, embodiments of the invention may provide distortion effects that lend an "organic" feel to a luminaire. Color dispersion properties of the outcoupler may be used to apply a color wash to a peripheral luminaire or wall while maintaining high quality white light to a work surface.

The removable outcoupler element of the invention allows for easy replacement of the OLED emitter into a more complex, and therefore expensive, luminaire. This is likely to be highly advantageous given the finite operating lifetime of OLEDs known today.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A device comprising:
   an emissive package configured to connect to a luminaire body to form a luminaire, said package comprising:
   an organic emissive component having a first side configured to connect to the luminaire body and a second side; and
   a self-contained index matching component disposed at least partially above the second side of the organic emissive component, the index matching component comprising a packet of index matching material;
   wherein at least a portion of the emissive package is replaceable separately from an outcoupling component of the luminaire; and
   wherein, when the emissive package is connected to the luminaire body, the index matching component is in direct physical contact with a surface of the outcoupling component and with the second side of the organic emissive component, such that there is no air gap between the organic emissive component and the outcoupling component.

2. The device of claim 1, wherein the organic emissive component is replaceable separately from the outcoupling component.

3. The device of claim 1, wherein the index matching component is replaceable separately from the outcoupling component.

4. The device of claim 1, wherein the index matching component is replaceable separately from the organic emissive component.

5. The device of claim 1, wherein the index-matching component comprises a gel pad.

6. The device of claim 1, wherein the index-matching component comprises a disposable gel packet.

7. The device of claim 1, wherein the index matching component comprises a gel sheet.

8. The device of claim 1, wherein the index-matching component comprises an encapsulated gel.

9. The device of claim 1, wherein the index-matching component has a refractive index of 1.4-2.0.

10. The replaceable component of claim 1, wherein the index matching material has an index of refraction within 90% of an index of refraction of the outcoupling component.

11. The device of claim 1, wherein the index matching material has an index of refraction within 90% of an index of refraction of an emissive surface material of the emissive component.

12. The device of claim 1, wherein the outcoupling component comprises a bulb having a shape selected from the group consisting of: a dome, pyramid, a parallelpiped, and a hemisphere.

13. The device of claim 12, wherein the emissive area of the organic emissive component has an outline shape substantially equivalent to a cross-section of the outcoupling component in a plane parallel to the organic emissive component.

14. The device of claim 1, wherein the emissive area of the organic emissive component has an outline shape substantially equivalent to a cross-section of the outcoupling component in a plane parallel to the organic emissive component.

15. The device of claim 1, wherein the index matching component comprises a transparent material having a Young's modulus of 0.1 MPa to 1 GPa.

16. The device of claim 1, wherein the organic emissive component comprises an OLED having an emissive area of about 60-90% of the area of the largest cross-section of the outcoupling component in a plane parallel with the OLED when the OLED is connected to the luminaire body.

17. The device of claim 16, wherein the organic emissive component comprises an OLED having an emissive area of about 60-75% of the area of the largest cross-section of the outcoupling component in a plane parallel with the OLED when the OLED is connected to the luminaire body.

18. The device of claim 1, wherein light provided by the luminaire comprises light having a first color viewable at a first angle from the luminaire and light having a second color, different from the first color, viewable at a second angle from the luminaire.

19. The device of claim 1, further comprising the outcoupling component, wherein the outcoupling component is disposed to outcouple light generated by the organic emissive component from the organic emissive component into an ambient region around the luminaire.

* * * * *